(12) United States Patent
Talwalkar et al.

(10) Patent No.: US 9,197,172 B2
(45) Date of Patent: Nov. 24, 2015

(54) SWITCHED MODE HIGH LINEARITY POWER AMPLIFIER

(71) Applicant: QUALCOMM Incorporated, San Diego, CA (US)

(72) Inventors: Niranjan Anand Talwalkar, San Jose, CA (US); Sanjay Kasturia, Los Altos Hills, CA (US)

(73) Assignee: QUALCOMM Incorporated, San Diego, CA (US)

( * ) Notice: Subject to any disclaimer, the term of this patent is extended or adjusted under 35 U.S.C. 154(b) by 116 days.

(21) Appl. No.: 14/029,041

(22) Filed: Sep. 17, 2013

(65) Prior Publication Data

US 2015/0077181 A1    Mar. 19, 2015

(51) Int. Cl.
*H03F 3/217* (2006.01)
*H03F 3/24* (2006.01)

(52) U.S. Cl.
CPC .............. *H03F 3/2175* (2013.01); *H03F 3/217* (2013.01); *H03F 3/24* (2013.01)

(58) Field of Classification Search
CPC ......... H03F 3/217; H03F 1/32; H03F 1/0288; H03F 2200/331; H03F 3/24; H03F 2200/351; H03F 3/2173; H03F 1/0277; H03F 2200/168; H03F 2200/451; H03F 3/2175; H03F 3/2171; H03K 7/08; H03K 7/10; H03M 3/506; H04L 25/4902; G06F 1/025
USPC ............................................. 330/10; 375/238
See application file for complete search history.

(56) References Cited

U.S. PATENT DOCUMENTS

| | | | |
|---|---|---|---|
| 7,200,187 B2 | 4/2007 | O'brien | |
| 7,330,069 B2 * | 2/2008 | Yamamura et al. | 330/10 |
| 7,492,217 B2 * | 2/2009 | Hansen et al. | 330/10 |
| 7,492,220 B2 * | 2/2009 | Chiu et al. | 330/10 |
| 7,733,171 B2 * | 6/2010 | Guilherme et al. | 330/10 |
| 7,952,508 B2 | 5/2011 | Crespi et al. | |
| 8,717,096 B2 * | 5/2014 | Wu | 330/10 |
| 2009/0102549 A1 | 4/2009 | Midya et al. | |
| 2009/0289704 A1 * | 11/2009 | Forte | 330/10 |
| 2009/0289708 A1 | 11/2009 | Beale et al. | |
| 2010/0156527 A1 * | 6/2010 | Midya et al. | 330/10 |
| 2012/0287985 A1 | 11/2012 | Okamura et al. | |

OTHER PUBLICATIONS

Gonzalez M.A.R., "Design and Implementation of Switching Voltage Integrated Circuits Based on Sliding Mode Control," Aug. 2009, 338 Pgs.
Morey B., et al., "Class D Audio Amplifier, The design of a live audio Class D audio amplifier with greater than 90% efficiency and less than 1% distortion," May 2008, 169 pages.

(Continued)

*Primary Examiner* — Khanh V Nguyen
(74) *Attorney, Agent, or Firm* — DeLizio Law, PLLC

(57) ABSTRACT

A switched mode, high linearity power amplifier can include a dynamic quantizer, a pulse width modulator and an output driver. In one embodiment, the dynamic quantizer can include a sigma-delta modulator configured to provide a multi-level digital signal. The pulse width modulator can receive the multi-level digital signal and provide a variable pulse width signal based, at least in part, on the multi-level digital signal. The output driver can include a class D output driver. The output driver can receive the variable pulse width signal to operate the class D output driver and provide an amplified signal. In one embodiment, the output driver can adjust the amplified signal to compensate for output errors.

33 Claims, 8 Drawing Sheets

(56) References Cited

OTHER PUBLICATIONS

Trehan, Chintan, "High Performance Class-D Amplifiers", Dissertation in electrical engineering for doctor of philosophy from Texas Tech University May 2007, pp. 1-164.
Berkhout, Marco, "Class-D Audio Amplifiers in Mobile Applications", IEEE Transactions on Circuits and Systems—I: Regular Papers, vol. 57, No. 5, May 2010, 11 pages.
Dooper, Lûtsen et al., "A 3.4 W Digital-In Class-D Audio Amplifier in 0.14 m CMOS", IEEE Journal of Solid-State Circuits, vol. 47, No. 7, Jul. 2012, 11 pages.
"Application No. PCT/US2014/055925, Invitation to Pay Add'l Fees and Partial Search Report", Jan. 5, 2015, 7 pages.
"PCT Application No. PCT/US2014/055925 International Search Report", Mar. 27, 2015, 16 pages.
Bicakci, et al., "A CMOS Line Driver for ADSL Central Office Applications", Solid-State Circuits, IEEE Journal of (vol. 38, Issue: 12), Dec. 2003, pp. 2201-2208, Dec. 2003, 8 pages.
Huiyun, et al., "A Digital Class D Amplifier Design embodying a novel Sampling Process and Pulse Generator", ISCAS 2001. The 2001 IEEE International Symposium on Circuits and Systems, Sydney, NSW, Australia., May 6, 2001, pp. 826-829.
Lam, et al., "Class-D Amplifier Power Stage With PWM Feedback Loop", IEEE Transactions On Power Electronics, vol. 28, No. 8, Aug. 2013, 12 pages.
Maughan, et al., "A Wide Band CMOS Class-D Line Driver for Wireline Communication", Circuits and Systems (MWSCAS), 53rd IEEE International Midwest Symposium, Aug. 2010, pp. 769-772, Aug. 2010, 4 pages.
Pate, et al., "A PCM to PWM Conversion Stage Resolution Enhancement Architecture", Circuits and Systems, 2005. 48th Midwest Symposium on Cincinnati, OH, Aug. 7, 2005, pp. 1653-1656.
Piessens, et al., "Highly Efficient xDSL Line Drivers in 0.35-mm CMOS Using Self-Oscillating Power Amplifier", Solid-State Circuits, IEEE Journal of vol. 38, Issue: 1, 2003, pp. 22-29, 2003, 8 pages.
Steen, "State of the Art Digital Pulse Modulated Amplifier System", AES, 23rd International Conference, Copenhagen, Denmark, May 23-25, 2003, 18 pages, Mar. 27, 2015, 18 pages.
Varona, et al., "A Low-Voltage Fully-Monolithic Delta-Sigma Class-D Audio Amplifier", Solid-State Circuits Conference, 2003. ESSCIRC '03. Proceedings of the 29th European, pp. 545-548, 2003, 4 pages.

\* cited by examiner

SWITCHED MODE HIGH LINEARITY POWER AMPLIFIER

BACKGROUND

Embodiments of the inventive subject matter generally relate to the field of communication systems and, more particularly, to signal power amplifiers used in communication systems.

A first communication device can transmit communication data to a second communication device through a communication medium. Examples of communication mediums can include power lines for Power Line Communications (PLC) and airwaves for wireless communications, such as wireless communications compliant with BLUETOOTH™, GSM, 3GPP or IEEE 802.11 specifications.

Transmitting data through the communication medium can consume substantial amounts power, particularly if communication data is transmitted as a wide bandwidth (e.g., 70 MHz or more) signal. Accurate linear data processing may increase the likelihood of successful transmission and reception of data. Commonly, class A or class A/B output stage topologies can be used to transmit the wide bandwidth communication data with good linearity, however class A or class A/B topologies can dissipate substantial amounts of power. A class A output stage can include circuits that are always biased on to conduct during all portions of an input cycle. Since the class A output stage is always conducting, even when input signals are quiescent, power is always being consumed. A class A/B output stage can include circuits arranged in a push-pull configuration that are biased on to conduct during positive and negative portions of the input cycle. Class A/B output stages can use slightly less power, compared to class A output stages, but can have increased distortion when the output crosses over from a positive portion to a negative portion. High levels of power dissipation can severely limit battery life and/or mobile operation of the communication device.

SUMMARY

Various embodiments are disclosed of a multi-level power amplifier. In some embodiments, the power amplifier can receive a data stream at a dynamic quantization module and can provide a multi-level digital signal based, at least in part, on the data stream. The multi-level digital signal can be received by a modulator. The modulator can generate a variable pulse width signal based, at least in part, on the multi-level digital signal. At least one pulse edge of the variable pulse width signal can be based on an output of a delay line. The variable pulse width signal may be amplified by an output stage to provide an output signal.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Figure 1:
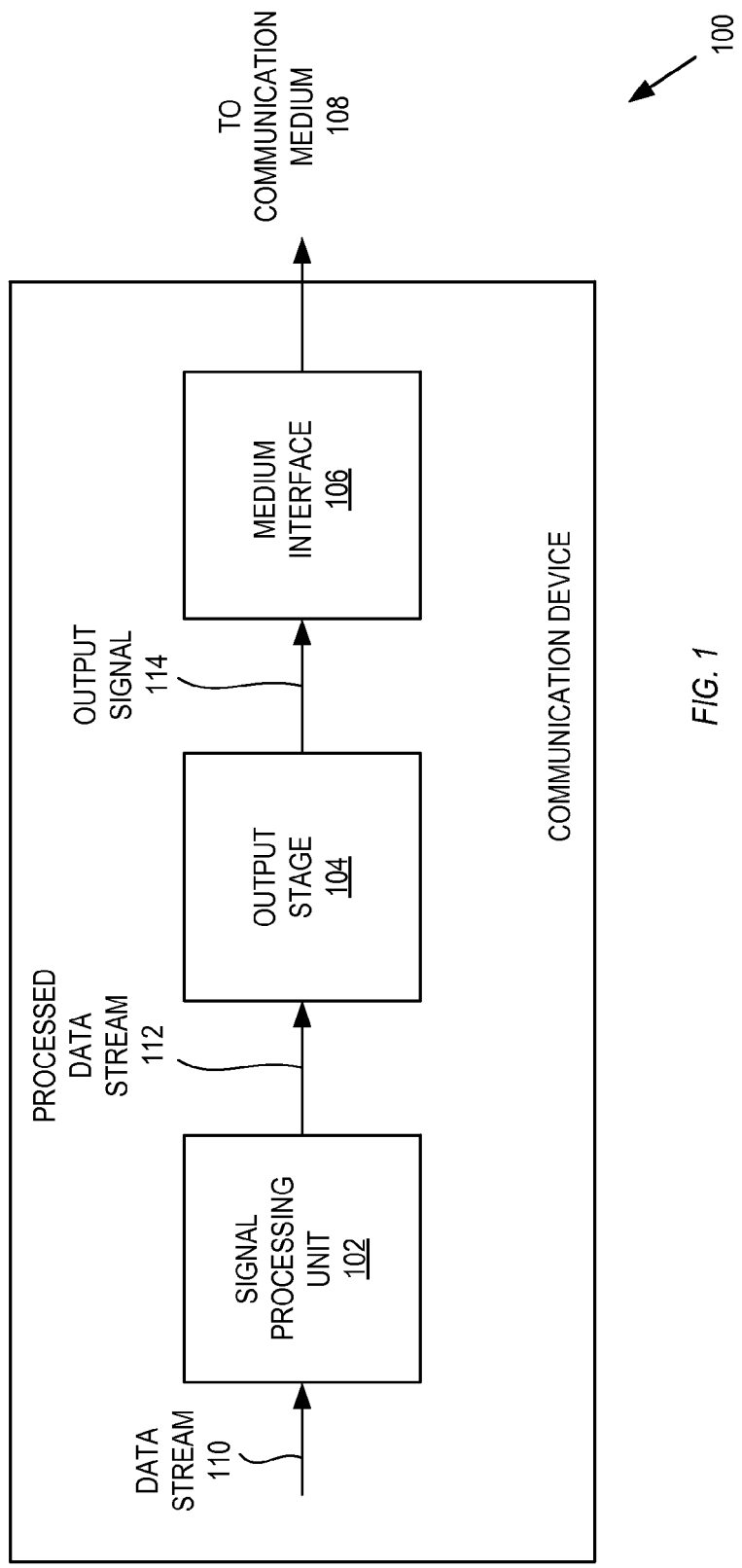
FIG. 1 is an example system diagram depicting a communication device.

The description that follows includes exemplary systems, methods, techniques and instruction sequences that embody techniques of the present inventive subject matter. However, it is understood that the described embodiments may be practiced without these specific details. For instance, although examples refer to Power Line Communications (PLC) devices, other technically feasible communication devices can be used, such as communication devices implementing IEEE 802.11 or ZIGBEE® of BLUETOOTH™ (hereinafter "Bluetooth") protocols. In other instances, well-known instruction instances, protocols, structures and techniques have not been shown in detail in order not to obfuscate the description.

Communication devices can use output drivers to transmit communication signals through a communication medium. Some communication devices may typically transmit communication signals at particular power levels in order to support particular protocol specifications. For example, if a communication device follows PLC protocols, then related communication signals provided by the communication device may have an output power level of up to 20 dBm. These output power levels can cause the output drivers to dissipate significant amounts of heat, particularly when wide band, linear performance is needed by the communication device to provide robust communication through the communication medium. Class A and class A/B topologies are well-known, linear output driver topologies that can be used by communication devices. However, the implementation of the class A and class A/B topologies can trade increased power dissipation for linear performance.

One approach to achieve the output power required by some protocols and achieve good efficiency is with a class D output topology. Class D output topologies, sometimes also referred to as class D output drivers or switched mode drivers, are naturally efficient because the topology typically uses a transistor quickly switched between a saturation mode (fully on) and a cutoff mode (fully off). Resistive power losses are low in the saturation and cutoff modes. Unfortunately, performance of the class D output topology may not be very linear. The non-linear performance of the class D output topology may limit the performance of some communication devices relying only on the class D output topology.

In one embodiment, an output stage of a communication device can include a switched mode, high linearity amplifier that can be realized by cascading a dynamic quantizer with a digital pulse width modulator and the class D output driver. The dynamic quantizer can act as a noise shaper and increase amplifier linearity by moving noise into frequency bands that are away from frequency bands that include communication data. In one embodiment, the dynamic quantizer can include a sigma-delta modulator that can process data, such as communication data and can provide a multi-level digital signal that moves noise into other frequency bands away from the communication data. A sigma-delta modulator, described further below, can provide modulated data based on noise feedback. Therefore, a sigma-delta modulator can provide dynamic noise shaping of digital signals. The dynamic quantizer is described in more detail in conjunction with FIG. 2 and FIG. 3 below.

The digital pulse width modulator can receive the multi-level digital signal from the dynamic quantizer and can provide a variable pulse width signal for use with the class D output driver. In one embodiment, the variable pulse width signal includes a pulse with a width that varies based on the multi-level digital signal. The digital pulse width modulator is also described in more detail in conjunction with FIGS. 2 and 3 below.

The class D output driver can receive the variable pulse width signal from the digital pulse width modulator and can amplify this signal for transmission through the communication medium. In one embodiment, the class D output driver can be configured to compensate (i.e., adjust) for output errors that are identified on the amplified signal. For example, the output of the class D output driver can be compared to the variable pulse width signal and, if any differences are determined between the two signals, the output of the class D output driver can be adjusted to compensate for the determined error. The output driver is described in more detail below in conjunction with FIG. 6.

FIG. 1 is an example system diagram depicting a communication device 100. The communication device 100 can transmit data to and receive data from other communication devices (not shown) coupled to a communication medium 108. The communication device 100 may include a transmitting section to process data for transmission and a receiving section to process data for reception. The receiving section of the communication device 100 is not shown in this and other figures herein to simplify the drawings.

The communication device 100 can include a signal processing unit 102, an output stage 104 and a medium interface 106. The signal processing unit 102 can prepare a data stream 110 for transmission via transmission components the communication medium 108. For example, the signal processing unit 102 can encode the data stream 110 with error correction information that can enable a receiving communication device (not shown) to correct errors in a signal detected in the receiving communication device. In other embodiments, the signal processing unit 102 can perform other processing tasks such as modulation, coding, packet formation, header and frame formation or signal processing tasks. Thus, the signal processing unit 102 can prepare data stream 110 for transmission and provide a processed data stream 112.

The output stage 104 can receive the processed data stream 112 and can convert the processed data stream 112 into an output signal 114 suitable for coupling to the communication medium 108. In some embodiments, the conversion of the processed data stream 112 can include an amplification or gain stage. For example, the output stage 104 can amplify power of the output signal 114. In one embodiment, the output stage can deliver an amplified signal as the output signal 114. In one embodiment, the output stage 104 can include a class D output driver arranged to provide an amplified signal based on the processed data stream 112. The output stage 104 is described in more detail below in conjunction with FIG. 2.

The medium interface 106 can receive the output signal 114 and can couple the output signal 114 to the communication medium 108. In one embodiment, the communication medium 108 can be a powerline medium and the medium interface 106 can couple the output signal 114 to the powerline medium, enabling communication device 100 to participate in PLC protocols such as, but not limited to, protocols described by a HomePlug® specification. In another embodiment, the communication medium 108 can be a wireless medium and the medium interface 106 can couple the output signal 114 to the wireless medium enabling wireless communications such as, but not limited to, communications compliant to IEEE 802.11 standards or Bluetooth protocols. The medium interface 106 can include components that enable the coupling of the output signal 114 to the communication medium 108. For example, if the communication medium 108 is a powerline medium, then medium interface 106 can include inductors, capacitors, filters etc. suitable for coupling the output signal 114 to the powerline medium.

Although the communication device 100 may spend more time receiving data than transmitting data, transmitting data can consume more total power compared to receiving data, and therefore have a greater effect on battery life. In one embodiment, power used to transmit data can be reduced through a switched mode, high linearity power amplifier included in the output stage 104. The output stage 104 including the switched mode, high linearity power amplifier is described in more detail below in conjunction with FIG. 2.

Figure 2:
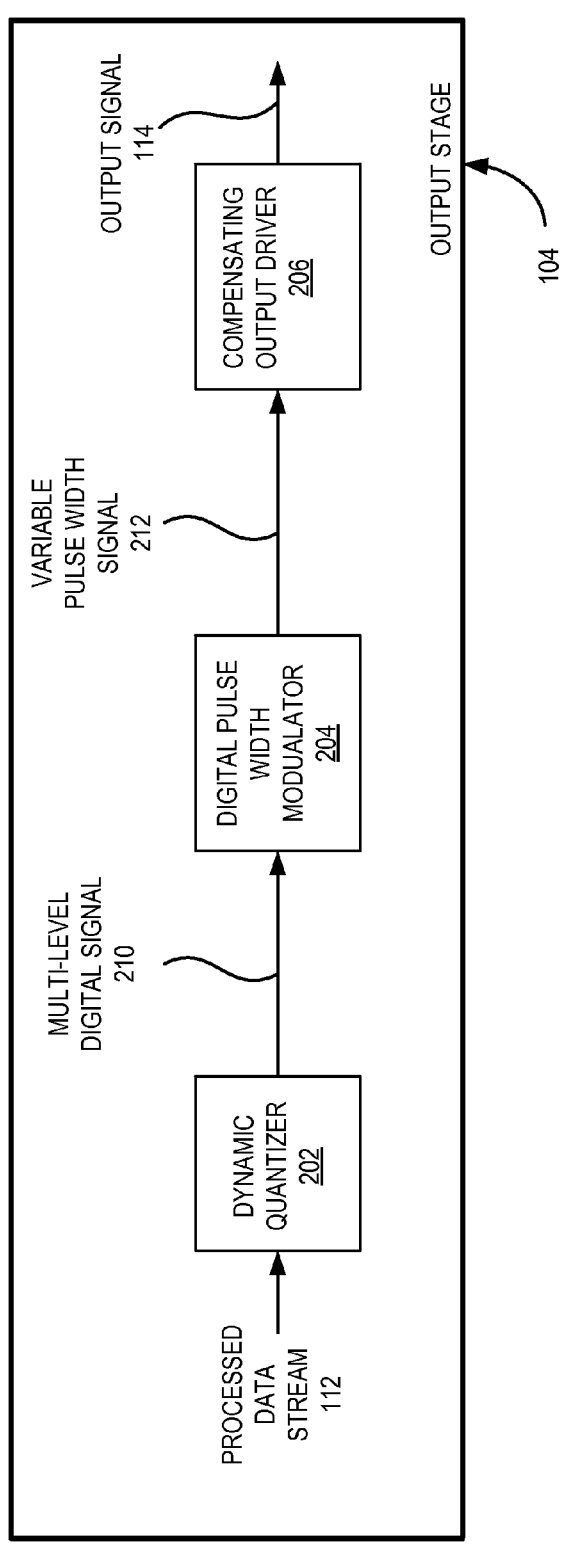
FIG. 2 is a simplified block diagram of one embodiment of the output stage of FIG. 1.

FIG. 2 is a simplified block diagram of one embodiment of the output stage 104. The output stage 104 can include a dynamic quantizer 202, a digital pulse width modulator 204 and a compensating output driver 206. As described above, the output stage 104 can receive the processed data stream 112 from the signal processing unit 102, and provide the output signal 114 to the medium interface 106. Thus, output stage 104 can apply suitable processing steps to transform the processed data stream 112 into the output signal 114. Often, the processed data stream 112 is in a digital form and the output signal 114 is in an analog form. In some embodiments, the output stage 104 can not only process a digital processed data stream 112 into an analog output signal 114, but can also provide the output signal 114 at a power level sufficient to meet power requirements that may be set forth by protocols used within the communication medium 108. Typical processing of the processed data stream 112 by output stage 104 is described below.

The dynamic quantizer 202 can include an upsampler (not shown), and a sigma-delta modulator (not shown). The dynamic quantizer 202 can shape noise, such as quantization noise associated with the processed data stream 112, by upsampling the processed data stream 112 with the upsampler and then shifting the noise in the processed data stream 112 to less desirable frequency bands with the sigma-delta modulator. Persons skilled in the art will appreciated that the sigma-delta modulator can include a feedback path based on a determined error between a current input (such as a current input sample i of the processed data stream 112) and a previous input (such as a previous input sample i−1 of the processed data stream 112). The sigma-delta modulator shifts noise using data from the feedback path and by reducing a quantization depth (bit depth) of the processed data stream 112. The sigma-delta modulator can provide a multi-level digital signal 210 that may be expressed as a digital signal n bits wide. The dynamic quantizer 202 is described in more detail in conjunction with FIGS. 3 and 4 below.

The digital pulse width modulator 204 can receive the multi-level digital signal 210 and provide a variable pulse width signal 212 to the compensating output driver 206. In one embodiment, the multi-level digital signal 210 can be a digital signal n bits wide while the variable pulse width signal 212 can be one bit wide. The variable pulse width signal 212 can include a pulse where the width of the pulse is based, at least in part, on the multi-level digital signal 210. The digital pulse width modulator 204 is described in more detail in conjunction with FIGS. 3 and 5 below.

The compensating output driver 206 can receive the variable pulse width signal 212, and provide the output signal 114 for transmission through the communication medium 108. The output signal 114 is based, at least in part, on the variable pulse width signal 212. In one embodiment, the compensating output driver 206 can include at least one class D output driver (not shown), and the variable pulse width signal 212 can be coupled to the class D output driver. The compensating output driver 206 can provide suitable power amplification to the output signal 114 prior to coupling to the medium interface 106.

In some embodiments, a switched mode, high linearity power amplifier can be implemented with the digital pulse width modulator 204, the dynamic quantizer 202 and the compensating output driver 206. The dynamic quantizer 202 can provide increased linearity by shifting noise away from frequencies that include communication data. Furthermore, the compensating output driver 206 can include a class D output driver and can provide increased efficiency. In one embodiment, the compensating output driver 206 can include a feedback capability that can enable compensation for output perturbations. The compensating output driver 206 is described in more detail below in conjunction with FIG. 5.

Figure 3:
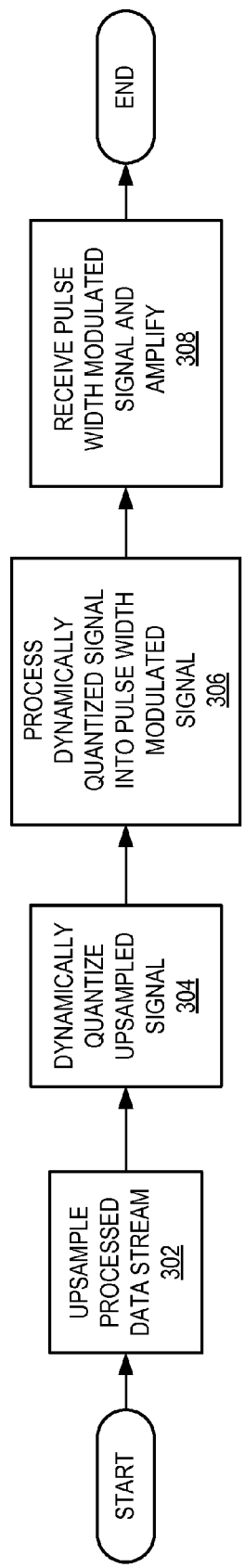
FIG. 3 is a flow diagram illustrating example operations for the output stage of FIG. 1.

FIG. 3 is a flow diagram illustrating example operations for the output stage 104. The operations illustrated in FIG. 3 are described with reference to systems and components described herein (for illustration purposes and not as a limitation). The example operations can be carried out by one or more components in the output stage 104 or the communication device 100. Beginning in block 302, the processed data stream 112 is upsampled. In one embodiment, the dynamic quantizer 202 can upsample the processed data stream 112 from a first sample rate to a second sample rate. For example, the first sample rate can be 150 MHz and the second sample rate can be 450 MHz. In one embodiment, block 302 can also use interpolation to upsample the processed data stream 112. Proceeding to block 304, the upsampled data (or upsampled and interpolated data) from block 302 is noise shaped through dynamic quantization where noise, such as sampling or quantization noise associated with the processed data stream 112 is shifted or moved to a less desirable frequency band, such as a frequency band that is higher than the frequency band carrying the communication data. In one embodiment, the noise shaping can be provided by a sigma-delta modulator configured to receive the upsampled data and provide the multi-level digital signal 210. The multi-level digital signal 210 can include three or more levels and can be encoded into a digital signal that is two or more bits wide. The dynamic quantizer 202 is described in more detail below in FIG. 4.

Proceeding to block 306, the multi-level (dynamically quantized) digital signal 210 is received and processed into the variable pulse width signal 212. As described above, the multi-level digital signal 210 can be n bits wide while the variable pulse width signal 212 can be one bit wide. The variable pulse width signal 212 can include a pulse where the width of the pulse is based, at least in part, on a portion of the multi-level digital signal 210. In one embodiment, the timing of rising and falling edges of the included pulse is determined by the multi-level digital signal 210. The digital pulse width modulator 204 is described in more detail in conjunction with FIG. 5.

Proceeding to block 308, the variable pulse width signal 212 is received by the compensating output driver 206 and amplified to provide the output signal 114 with sufficient power for coupling to the communication medium 108 and the flow ends. In one embodiment, suitable power amplification is provided by a class D output driver included in the compensating output driver 206. In yet another embodiment, the compensating output driver 206 can include a feedback path that can enable compensation for output perturbations. For example if the output signal 114 is too low when compared to a reference signal, the compensating output driver 206 can detect such a condition and provide correction so that the output signal 114 is provided at the correct level. The compensating output driver 206 is described in more detail in conjunction with FIG. 6 below.

Figure 4:
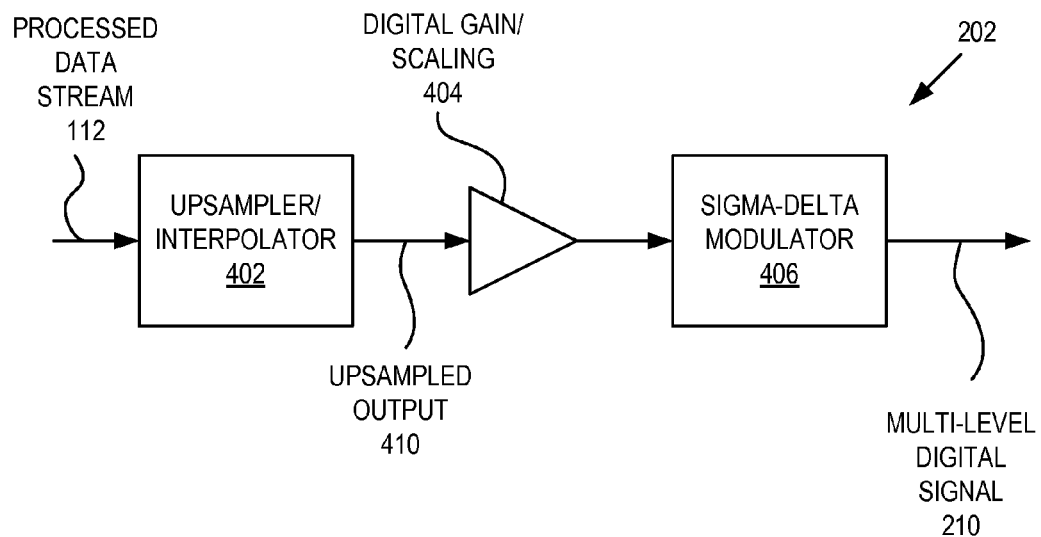
FIG. 4 is an example block diagram of the dynamic quantizer shown in FIG. 2.

FIG. 4 is an example block diagram of the dynamic quantizer 202 shown in FIG. 2. In general, the dynamic quantizer 202 can reduce noise associated with an input signal by shifting a noise spectrum and reducing a bit depth of the input signal. The dynamic quantizer 202 can include a sigma-delta modulator 406 arranged to provide modulated data based on noise feedback as described above. The dynamic quantizer 202 can also include an upsampler and interpolator block 402 and a gain/scaling block 404.

The upsampler and interpolator block 402 can receive the processed data stream 112 at a first sampling frequency and upsample the processed data stream 112 to a second sampling frequency, greater than the first sampling frequency. The upsampler and interpolator block 402 can also provide an interpolation function to determine upsampled data. For example, the upsampled data can be determined by interpolating between known data samples in the processed data stream 112. The interpolation can be provided by any suitable function such as an averaging function that seeks to determine an average value between two known data samples. The upsampler and interpolator block 402 can provide an upsampled output 410. In one embodiment, the upsampler and interpolator block 402 can receive the processed data stream 112 that is eleven bits wide at a first sampling frequency of 150 MHz and provide the upsampled output 410 that is eleven bits wide at 450 MHz. In other embodiments, the processed data stream 112 can have other bit widths. For example, sufficient bits widths should be used to provide a desired linearity and frequency response of the output stage 104.

The upsampled output 410 is provided to the gain/scaling block 404. In one embodiment, the gain/scaling block 404 can provide a digital gain or scaling adjustment of the upsampled output 410 provided by the upsampler and interpolator block 402. In some embodiments, the processing provided by the gain/scaling block 404 can be optional. The gain or scaling adjustment can be useful in compensating for gain mis-matches that may appear within the output stage 104 or within other processing areas included in the signal processing unit 102. The output of the gain/scaling block 404 is coupled to the sigma-delta modulator 406.

The sigma-delta modulator 406 can employ a feedback loop to shape the noise spectrum associated with the output received from the gain/scaling block 404. In one embodiment, the sigma-delta modulator 406 can reduce the bit depth of the output of the gain/scaling block 404 to and provide a multi-level digital signal 210 with fewer quantization steps. In one embodiment, the sigma-delta modulator 406 can be a second or higher order sigma-delta modulator. Persons skilled in the art will recognize that the sigma-delta modulator 406 can be configured to be higher order (i.e., greater than a first order) by including two or more integration sections within the feedback loop. Higher order sigma-delta modulators can provide greater noise shaping when compared to sigma delta modulators with a lower order. In one embodiment, the input to the sigma-delta modulator 406 can be eleven bits wide at 450 MHz, while the multi-level digital signal 210 from the sigma-delta modulator 406 can be five bits wide at 450 MHz.

Figure 5:
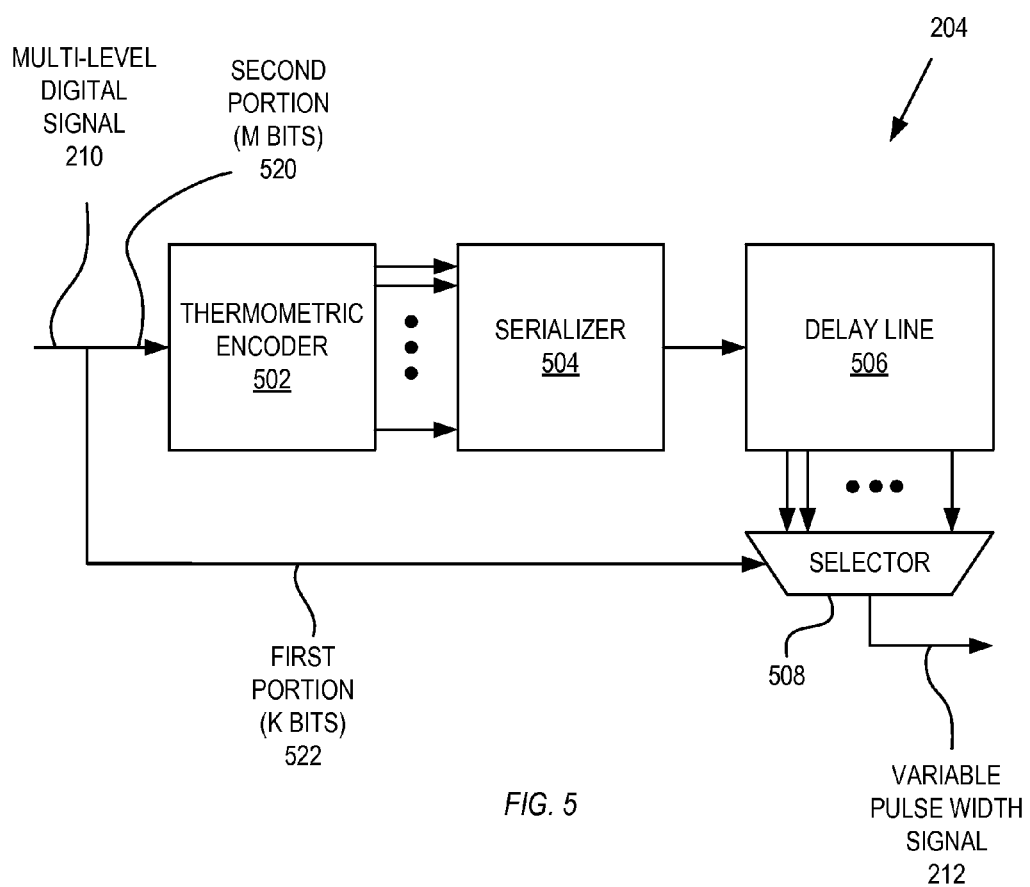
FIG. 5 is an example block diagram of the digital pulse width modulator shown in FIG. 2.

FIG. 5 is an example block diagram of the digital pulse width modulator 204. The digital pulse width modulator 204 can receive the multi-level digital signal 210 from the dynamic quantizer 202 and generate a variable pulse width signal 212 that can be used to control an output stage, such as the compensating output driver 206. In one embodiment, the digital pulse width modulator 204 can generate a signal with a pulse width corresponding to the multi-level digital signal 210. The digital pulse width modulator 204 can include a thermometric encoder 502, a serializer 504, a delay line 506 and a selector 508. The multi-level digital signal 210 can be split into a first portion 522 and a second portion 520. For example, if the multi-level digital signal 210 is made up of n bits, the first portion 522 of the multi-level digital signal 210 can be formed from k least significant bits (where k<n) and the second portion 520 of the multi-level digital signal 210 can be formed from the remaining m bits (m=n−k), which represent the m most significant bits of the multi-level digital signal 210.

The second portion 520 of the multi-level digital signal 210 is coupled to the thermometric encoder 502. In one embodiment, the thermometric encoder 502 can be a unary encoder and can receive the m bits of the second portion 520 of the multi-level digital signal 210 and provide a number of "1" bits to represent the m bits. For example, if m=2, then the second portion 520 of the multi-level digital signal 210 can represent (unsigned) numbers from 0 to 3 The thermometric encoder 502 can encode the 2 bits into 4 bits as shown below in table 1. Table 1 shows only one possible thermometric encoding; other encoding schemes are possible.

TABLE 1

Example thermometric encoding for 2 bits

| Thermometric Input (decimal) | Thermometric Input (binary) | Thermometric Encoding |
|---|---|---|
| 0 | 00 | 0000 |
| 1 | 01 | 0001 |
| 2 | 11 | 0011 |
| 3 | 11 | 0111 |

The serializer 504 can receive the output of the thermometric encoder 502 and serialize the output of the thermometric encoder 502 by providing each bit of the thermometric encoder 502 as an output of the serializer 504 by selecting each bit from the thermometric encoder 502 in sequence. In one embodiment, the clock cycle period (or clock period) of the serializer 504 is related to the number of bits provided by the output of the thermometric encoder 502 and the clock period of the dynamic quantizer 202. For example if the thermometric encoder 502 produces x bits for each dynamic quantizer 202 clock period T seconds long, then the clock period of the serializer 504 should be T/x. As an example, if the output of the dynamic quantizer 202 is five bits at 450 MHz, and the second portion 520 is two bits wide, then the output of the thermometric encoder 502 can be four bits at 450 MHz. (In this example, the clock period is 1/450 MHz or about 2.22 ns in duration). Thus, the clock period of the serializer 504 is approximately 2.22 ns/4 or about 555 ps (in this example, the serializer 504 operates at 1.8 GHz).

The output of the serializer 504 is coupled to the delay line 506. The delay line 506 can provide two or more outputs, where each output delays the input to the delay line 506 by a fractional serializer clock period. In one embodiment, the fractional serializer clock period can be based, at least in part, on a number of delay line 506 outputs. For example, if the delay line 506 is be configured with w outputs, then each output is delayed by serializer clock period/w seconds. Returning to our example above, if the clock period of the serializer is 555 ps and the delay line 506 has eight outputs, then the output delay of each delay line output is 555 ps/8 or about 69 ps.

The output of the delay line 506 is coupled to the selector 508. The selector 508 can select one of the outputs of the delay line 506 based upon the first portion 522 of the multi-level digital signal 210. The output of the selector is the variable pulse width signal 212.

The digital pulse width modulator 204 as described in FIG. 5, can vary at least one edge (i.e., falling edge or a rising edge) of the variable pulse width signal 212 based on the multi-level digital signal 210. In other embodiments, both edges (i.e., rising and falling edges) can vary in accordance with the multi-level digital signal 210. In some embodiments, particular values of the multi-level digital signal 210 can be restricted or limited (herein referred to as forbidden values). That is, particular values of the multi-level digital signal 210 that are outside a predetermined range of allowable values may be replaced with a predetermined (minimum or maximum) value. Some particular values can produce short duration pulses in the variable pulse width signal 212. Some short pulses may be too narrow and may not be tolerated by other processing blocks, such as the compensating output driver 206. By restricting the forbidden values to a predetermined value, the digital pulse width modulator 204 can prevent the generation of arbitrarily small (runt) pulses.

Efficiency of the output stage 104 including the digital pulse width modulator 204 and the compensating output driver 206 is related to a nominal frequency of the variable pulse width signal 212. While higher frequencies can decrease an efficiency of the compensating output driver 206, lower frequencies can decrease the effectiveness of the dynamic quantizer 202. In one embodiment, frequencies of the variable pulse width signal 212 can be about ten times greater than the bandwidth of the communication data. The example clock frequencies and times described above are meant only to aid in understanding the operation of the digital pulse width modulator 204. The clock frequencies and delay times described herein are not meant to limit the implementation or functionality of the digital pulse width modulator 204 in any way.

Figure 6:
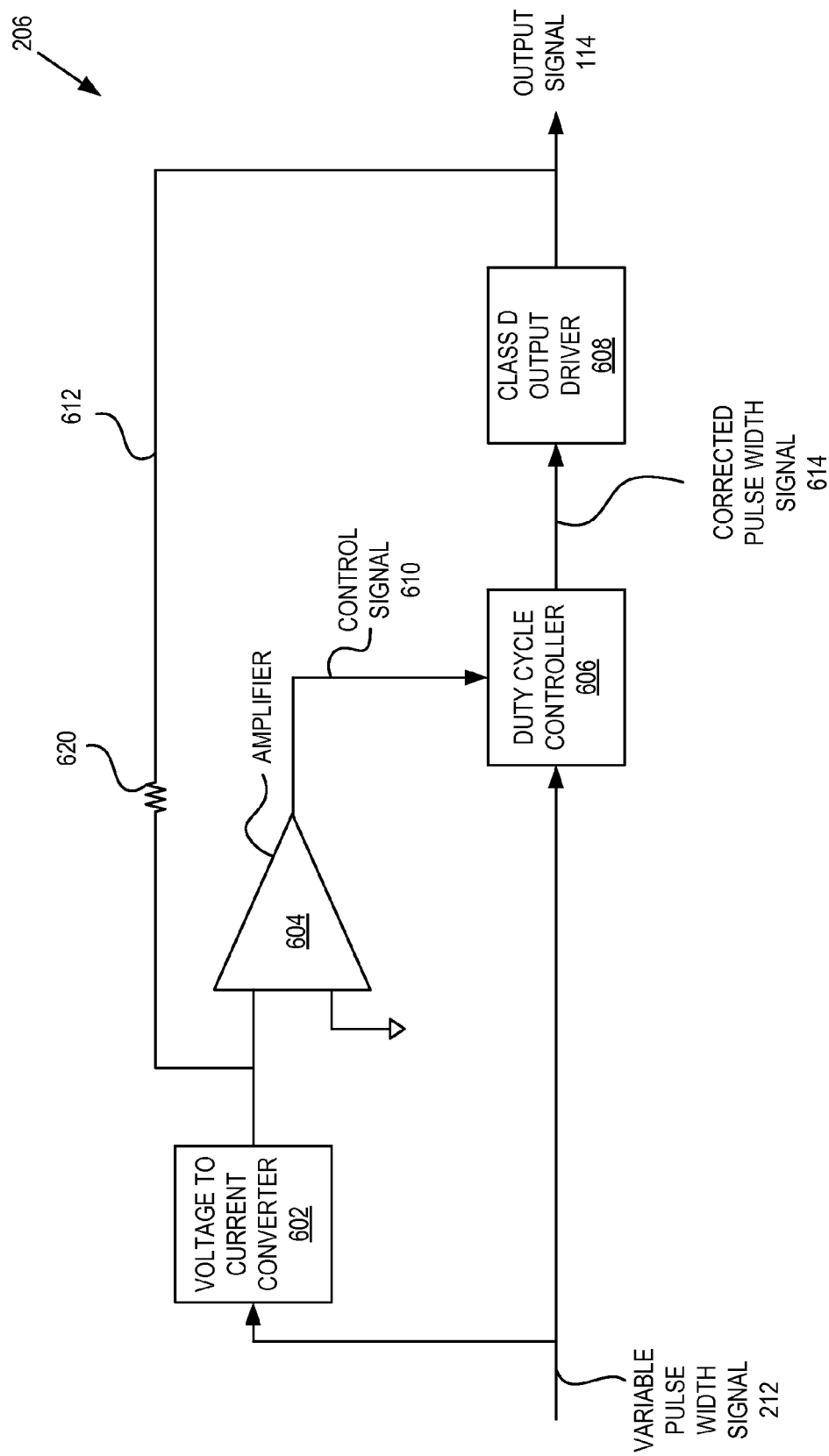
FIG. 6 is an example block diagram of the compensating output driver shown in FIG. 2.

FIG. 6 is an example block diagram of the compensating output driver 206. The compensating output driver 206 receives the variable pulse width signal 212 and provides the output signal 114 to the medium interface 106. The compensating output driver 206 can adjust the output signal 114 to compensate for a difference between the output signal 114 and a reference signal. In one embodiment, the compensating output driver 206 can include a class D output driver 608 and a duty cycle controller 606. The class D output driver 608 can include any suitable driver component such as a switching transistor (NMOS device, PMOS device or Bipolar device, for example) configured to sink or source current or voltage to a load in accordance with a signal, such as a pulse signal. The variable pulse width signal 212 is coupled to the class D output driver 608 through the duty cycle controller 606. In one embodiment, the duty cycle controller 606 can adjust the timing of the pulse edges of the corrected pulse width signal 614 provided to the class D output driver 608. The timing adjustment is responsive to control signal 610. In one embodiment, the range of adjustment provided by the duty cycle controller 606 can be limited to fractions of an original duty cycle of the variable pulse width signal 212. Embodiments of the duty cycle controller 606 can be designed to maintain a linear relationship between the control signal 610 and the amount of timing adjustment provided to the pulse edges. As the timing of the pulse edges received by the duty cycle controller 606 is adjusted throughout the range of adjustment, a linear relationship is maintained between the timing change and the control signal 610. In one embodiment, the duty cycle controller 606 can receive the variable pulse width signal 212 and can adjust the timing of the pulse edges of the variable pulse width signal 212 to provide the corrected pulse width signal 614. In this manner, the corrected pulse signal 614 provided to the class D output driver 608 can be based on, in large part, the variable pulse width signal 212.

The compensating output driver 206 can compare the output signal 114 provided by the class D output driver 608 to the variable pulse width signal 212 and can adjust (compensate) for differences detected in the output signal 114. If the output signal 114 is greater than or less than the variable pulse width signal 212, a control signal 610 can be generated based, at least in part, on the difference between these two signals (output signal 114 and variable pulse width signal 212). The control signal 610 can be used to control the duty cycle controller 606 to adjust the timing of the pulse edges of the variable pulse width signal 212. Any technically feasible means of signal comparison can be used to generate the control signal 610. In one embodiment, the variable pulse width signal 212 can be converted to a current by a voltage to current converter 602. A feedback signal 612 from output signal 114 can be converted to a current by a resistor 620. An amplifier 604 can determine the difference between the current from the voltage to current converter 602 and the current from feedback signal 612 and generate the control signal 610, based on a difference in the currents. Although shown as a current comparison in this example, a voltage comparison can also be used to generate the control signal 610. In yet another embodiment, a mixed comparison (a current signal and a voltage signal) can be performed. In either approach (current, voltage or mixed comparison), care is be taken to scale the compared signals to correctly bias the output signal 114. The feedback loop including the amplifier 604, duty cycle controller 606 and class D output driver 608 can be designed such that the control signal 610 is limited to ranges that provide linear operation of the duty cycle controller 606.

The bandwidth of the output signal 114 can be based on modulation and coding applied to the communication data. Returning to our earlier example regarding PLC communications, the bandwidth of the communication data can be 70 MHz. To achieve a satisfactory compensation function, the closed-loop bandwidth of the compensating output driver 206 must be at least as much as the bandwidth of the communication data. To ensure stable operation at such large bandwidths, it is desirable that the propagation delays of the feedback loop in the compensating driver 206 as well as the amplifier 604 and duty cycle controller 606 are kept at least 0.1× relative to the inverse of the closed-loop bandwidth. These delays can be designed to be as low as 1 ns.

Figure 7:
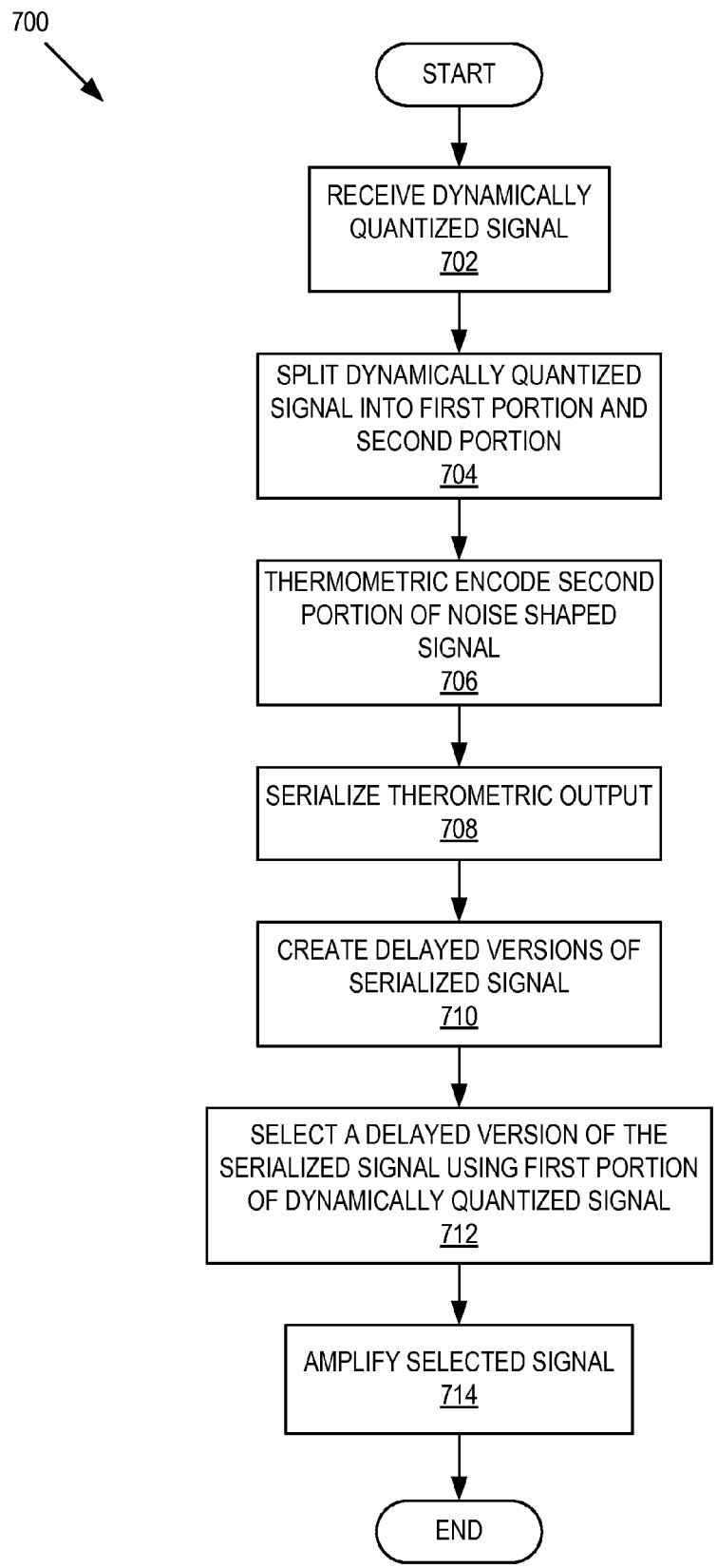
FIG. 7 is a flow diagram illustrating example operations for the communication device.

FIG. 7 is a flow diagram illustrating example operations for the communication device 100. The operations illustrated in FIG. 7 are described with reference to the systems and components described herein (for illustration purposes and not as a limitation). The example operations can be carried out by one or more components in the communication device 100 such as the output stage 104, the dynamic quantizer 202 or the digital pulse width modulator 204. Beginning in block 702, a dynamically quantized signal is received. In one embodiment, the dynamically quantizer signal is a multi-level digital signal 210 provided by the dynamic quantizer 202. In another embodiment, the multi-level digital signal 210 can be provided by the sigma-delta modulator 406. Proceeding to block 704, the dynamically quantized signal is split into a first portion 522 and a second portion 520. For example, if the dynamically quantized signal is the n bit wide multi-level digital signal 210, the first portion 522 can be k bits wide (k<n) and the second portion 520 can be m bits wide (m=n−k). Proceeding to block 706, the thermometric encoder 502 can receive the second portion 520 of the multi-level digital signal 210 and provide a thermometric encoded output. For example the m bits of the second portion 520 can be unary encoded to provide a number of "1" bits to represent the m bits of the second portion 520. Proceeding to block 708, the thermometric encoded output is serialized. As described above, the serializer 504 can receive the output of the thermometric encoder 502 and can provide a serialized output. Proceeding to block 710, delayed versions of the serialized output can be provided. In one embodiment, delayed versions can be provided by the delay line 506 with multiple delayed outputs. In one embodiment, the delay period between of the delay line outputs can be fractions of a clock period used to serialize the thermometric encoder 502 output.

Proceeding to block 712, one of the delayed versions from the delay line 506 can be selected as the variable pulse width signal 212. In one embodiment, the selection can be based at least in part on the first portion 522 of the dynamically quantized signal. Proceeding to block 714, the variable pulse width signal 212 is amplified and is provided as the output signal 114 and the flow ends. For example, the variable pulse width signal 212 can be amplified by a class D output driver 608 or a compensating output driver 206.

Figure 8:
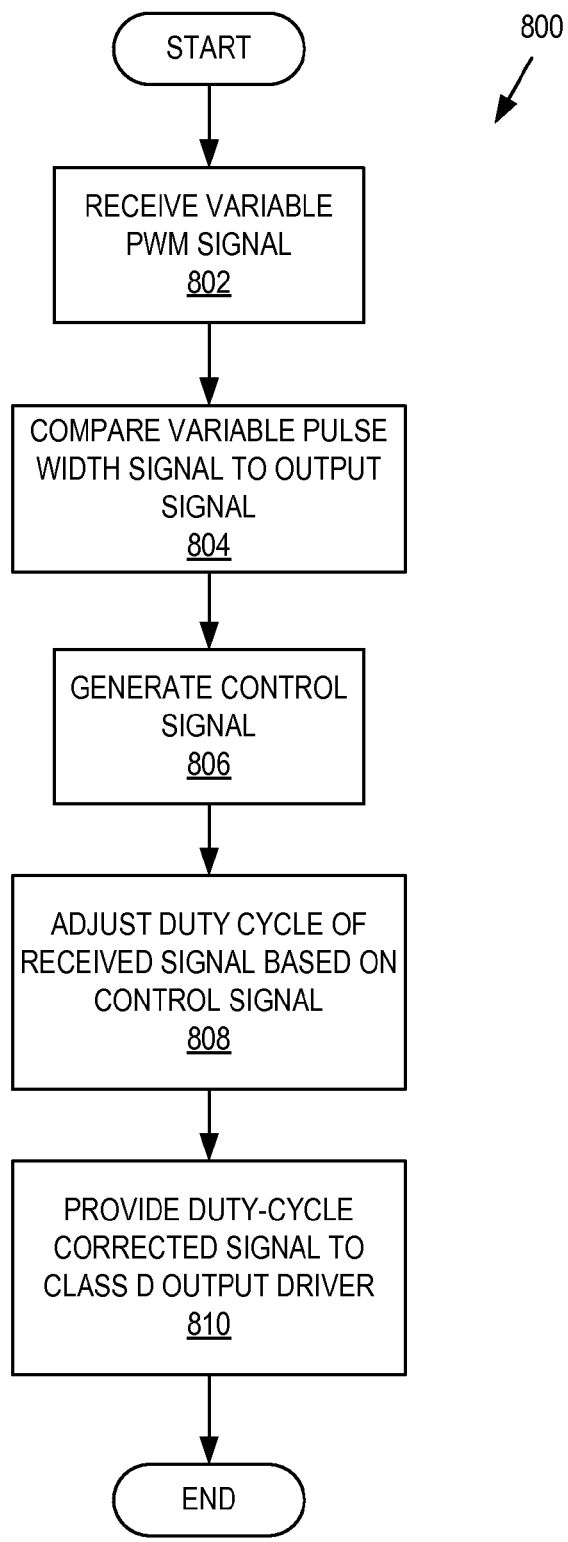
FIG. 8 is another flow diagram for example operations for a communication device.

FIG. 8 is another flow diagram for example operations for a communication device 100. The operations illustrated in FIG. 8 are described with reference to the systems and components described herein (for illustration purposes and not as a limitation). The example operations can be carried out by one or more components in the communication device 100 such as the output stage 104 or the compensating output driver 206. The flow can begin in block 802, where the variable pulse width signal 212 is received. In one embodiment, the variable pulse width signal 212 can be provided by the digital pulse width modulator 204. Proceeding to block 804, the variable pulse width signal 212 is compared to the output signal 114. In one embodiment, the output signal 114 can be provided by the class D output driver 608. The comparison can determine if the output signal 114 is greater than or less than the variable pulse width signal 212. In one embodiment, the output signal 114 and the variable pulse width signal 212 can be converted to current representations for the comparison. In another embodiment, the output signal 114 and the variable pulse width signal 212 can be converted to voltage representations for the comparison. Proceeding to block 806, a control signal 610 is generated in accordance with the determined difference between the output signal 114 and the variable pulse width signal 212. In one embodiment, the amplifier 604 can provide the control signal 610 in accordance with the difference between the variable pulse width signal 212 and the output signal 114. Proceeding to block 808, the duty cycle of the variable pulse width signal 212 is adjusted in accordance with the control signal 610. In one embodiment, the duty cycle controller 606 can provide the corrected pulse width signal 614 based, at least in part, on the control signal. Proceeding to block 810, the corrected pulse width signal 614 can be provided to the class D output driver and the flow ends. In one embodiment, the class D output driver can be an NMOS, PMOS or bipolar transistor or other similar component.

It should be understood that FIGS. 1-8 and the operations described herein are examples meant to aid in understanding embodiments and should not be used to limit embodiments or limit scope of the claims. Embodiments may perform additional operations, fewer operations, operations in parallel or in a different order, and some operations differently.

As will be appreciated by one skilled in the art, aspects of the present inventive subject matter may be embodied as a system, method, or computer program product. Accordingly, aspects of the present inventive subject matter may take the form of an entirely hardware embodiment, a software embodiment (including firmware, resident software, microcode, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more non-transitory computer readable medium(s) may be utilized. Non-transitory computer-readable media comprise all computer-readable media, with the sole exception being a transitory, propagating signal. The non-transitory computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code embodied on a computer readable medium for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 9:
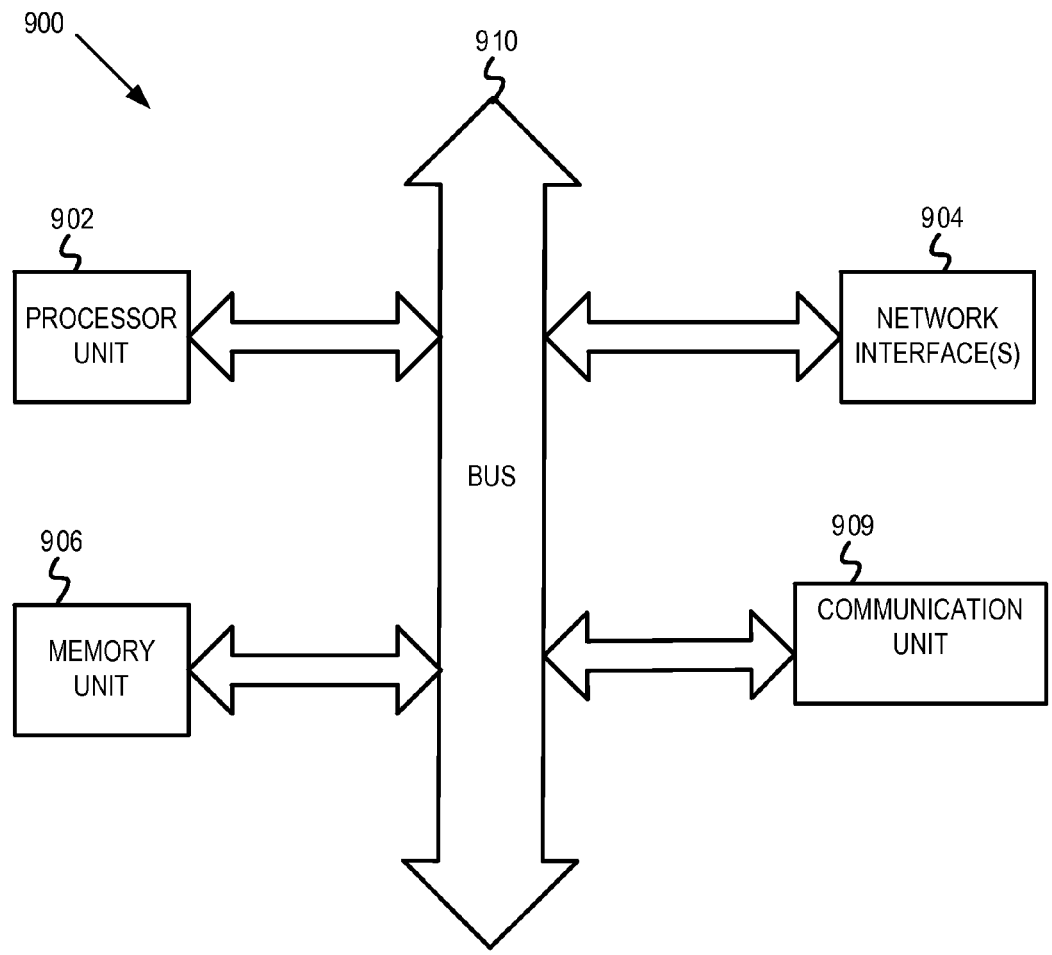
FIG. 9 is an example block diagram of one embodiment of an electronic device including a switched mode, high linearity power amplifier.

FIG. 9 is an example block diagram of one embodiment of an electronic device 900 including a switched mode, high linearity power amplifier in accordance with this disclosure. In some implementations, the electronic device 900 may be one of a laptop computer, a netbook, a mobile phone, a powerline communication device, a personal digital assistant (PDA), etc. The electronic device 900 may include a processor unit 902 (possibly including multiple processors, multiple cores, multiple nodes, and/or implementing multi-threading, etc.). The electronic device 900 may include a memory unit 906. The memory unit 906 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The electronic device 900 may also include a bus 910 (e.g., PCI, ISA, PCI-Express, HyperTransport®, InfiniBand®, NuBus, AHB, AXI, etc.), and network interfaces 904 that include at least one of a wireless network interface (e.g., a WLAN interface, a BLUETOOTH® (Bluetooth) interface, a WiMAX interface, a ZigBee® interface, a Wireless USB interface, etc.) and a wired network interface (e.g., an Ethernet interface, a powerline communication interface, etc.). In some implementations, the electronic device 900 may support multiple network interfaces—each of which is configured to couple the electronic device 900 to a different communication network.

In some embodiments, the components described in FIGS. 1-2 and 4-6 may be included as part of a communication unit 909. For example, the communication unit 909 may implement component techniques described above in FIGS. 1-8. It should be understood, that in some embodiments, the communication unit 909 may also have a dedicated processor (e.g., such as a communication unit comprising a system on a chip, or board with multiple chips, or multiple boards, in which the communication may have one or more dedicated processor or processing unit(s), in addition to the main processor 902). Any one of these functionalities may be partially (or entirely) implemented in hardware and/or on the processor unit 902. For example, the functionality may be implemented with an application specific integrated circuit, in logic implemented in the processor unit 902, in a co-processor on a peripheral device or card, etc. Further, realizations may include fewer or additional components not illustrated in FIG. 9 (e.g., video cards, audio cards, additional network interfaces, peripheral devices, etc.). The processor unit 902, the memory unit 906, and the network interfaces 906 are coupled to the bus 910. Although illustrated as being coupled to the bus 910, the memory unit 906 may be coupled to the processor unit 902.

While the embodiments are described with reference to various implementations and exploitations, it will be understood that these embodiments are illustrative and that the scope of the inventive subject matter is not limited to them. In general, techniques for providing a switched mode, high linearity power amplifier as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A device comprising:
   a dynamic quantizer configured to generate a multi-level digital signal based, at least in part, on an input signal;
   a digital pulse width modulator coupled to the dynamic quantizer and comprising a delay line, the digital pulse width modulator configured to generate a variable pulse width signal based, at least in part, on the multi-level digital signal, wherein at least one pulse edge of the variable pulse width signal is delayed via a first output from the delay line; and
   an output driver coupled to the digital pulse width modulator, the output driver comprising a duty cycle controller configured to generate a corrected pulse width signal based, at least in part, on a control signal and the variable pulse width signal.

2. The device of claim 1, wherein the delay line includes the first output and a second output, wherein the digital pulse width modulator is configured to delay the at least one pulse edge by a first delay period via the first output or by a second delay period via the second output.

3. The device of claim 2, wherein the digital pulse width modulator further comprises a selector configured to select the first output or the second output based, at least in part, on a portion of the multi-level digital signal.

4. The device of claim 2, wherein the digital pulse width modulator further comprises a selector configured to provide the variable pulse width signal to the output driver.

5. The device of claim 2, wherein the first delay period and the second delay period are fractional portions of a digital pulse width modulator clock period.

6. The device of claim 1, wherein the digital pulse width modulator further comprises a thermometric encoder, the thermometric encoder configured to receive a portion of the multi-level digital signal and generate a unary encoded signal based, at least in part, on the portion of the multi-level digital signal.

7. The device of claim 6, wherein the digital pulse width modulator further comprises a serializer coupled to the thermometric encoder, the serializer configured to serialize the unary encoded signal and provide the serialized unary encoded signal to the delay line.

8. The device of claim 1, wherein the dynamic quantizer comprises a sigma-delta modulator configured to generate and provide the multi-level digital signal to the digital pulse width modulator.

9. The device of claim 1, wherein the output driver further comprises a class D output driver coupled to the duty cycle controller, the class D output driver configured to amplify the corrected pulse width signal to generate an output signal.

10. The device of claim 9, wherein the control signal is based, at least in part, on a difference between the output signal and the variable pulse width signal.

11. The device of claim 9, wherein the output driver further comprises an amplifier configured to generate the control signal based, at least in part, on a difference between the output signal and the variable pulse width signal.

12. A method for processing a data stream comprising:
    receiving, at a dynamic quantizer, the data stream;
    generating a multi-level digital signal based, at least in part, on the data stream;
    receiving, at a modulator, the multi-level digital signal;
    generating a variable pulse width signal based, at least in part, on the multi-level digital signal, wherein at least one pulse edge of the variable pulse width signal is delayed via a first output from a delay line of the modulator;
    receiving, at an output driver, the variable pulse width signal; and
    generating a corrected pulse width signal based, at least in part, on a control signal and the variable pulse width signal.

13. The method of claim 12, wherein the delay line includes the first output and a second output, wherein the at least one pulse edge is delayed by a first delay period via the first output or by a second delay period via the second output.

14. The method of claim 13, further comprising selecting the first output or the second output based, at least in part, on a portion of the multi-level digital signal.

15. The method of claim 13, wherein the first delay period and the second delay period are fractional portions of a digital pulse width modulator clock period.

16. The method of claim 12, further comprising generating a unary encoded signal based, at least in part, on a second portion of the multi-level digital signal.

17. The method of claim 16, further comprising serializing the unary encoded signal and providing the serialized unary encoded signal to the delay line.

18. The method of claim 12, wherein the output driver includes a class D output driver, further comprising amplifying, by the class D output driver, the corrected pulse width signal to generate an output signal.

19. The method of claim 18, wherein the control signal is based, at least in part, on a difference between the output signal and the variable pulse width signal.

20. A device comprising:
    means for receiving, at a dynamic quantizer, a data stream;
    means for generating a multi-level digital signal based, at least in part, on the data stream;

means for receiving, at a modulator, the multi-level digital signal;

means for generating a variable pulse width signal based, at least in part, on the multi-level digital signal, wherein at least one pulse edge of the variable pulse width signal is delayed via a first output from a delay line of the modulator;

means for receiving, at an output driver, the variable pulse width signal; and means for generating a corrected pulse width signal based, at least in part, on a control signal and the variable pulse width signal.

21. The device of claim 20, wherein the delay line includes the first output and a second output, wherein the at least one pulse edge is delayed by a first delay period via the first output or by a second delay period via the second output.

22. The device of claim 21, further comprising means for selecting the first output or the second output based, at least in part, on a portion of the multi-level digital signal.

23. The device of claim 20, further comprising means for amplifying the corrected pulse width signal to generate an output signal.

24. A device comprising:
a dynamic quantizer configured to generate a multi-level digital signal based, at least in part, on an input signal;
a digital pulse width modulator coupled to the dynamic quantizer and comprising a thermometric encoder and a delay line, the thermometric encoder configured to generate a unary encoded signal based, at least in part, on a first portion of the multi-level digital signal, wherein the digital pulse width modulator is further configured to generate a variable pulse width signal based, at least in part, on the unary encoded signal, wherein at least one pulse edge of the variable pulse width signal is delayed via a first output from the delay line; and
an output driver coupled to the digital pulse width modulator and configured to generate an amplified variable pulse width signal.

25. The device of claim 24, wherein the digital pulse width modulator further comprises a serializer coupled to the thermometric encoder, the serializer configured to serialize the unary encoded signal and provide the serialized unary encoded signal to the delay line.

26. The device of claim 24, wherein the delay line includes the first output and a second output, wherein the digital pulse width modulator is configured to delay the at least one pulse edge by a first delay period via the first output or by a second delay period via the second output.

27. The device of claim 26, wherein the digital pulse width modulator further comprises a selector configured to select the first output or the second output based, at least in part, on a second portion of the multi-level digital signal.

28. The device of claim 26, wherein the first delay period and the second delay period are fractional portions of a digital pulse width modulator clock period.

29. A method for processing a data stream comprising:
receiving, at a dynamic quantizer, the data stream;
generating a multi-level digital signal based, at least in part, on the data stream;
receiving, at a modulator, the multi-level digital signal;
generating a unary encoded signal based, at least in part, on a first portion of the multi-level digital signal;
generating a variable pulse width signal based, at least in part, on the unary encoded signal, wherein at least one pulse edge of the variable pulse width signal is delayed via a first output from a delay line of the modulator; and
receiving, at an output driver, the variable pulse width signal and generating an amplified variable pulse width signal.

30. The method of claim 29, further comprising serializing the unary encoded signal and providing the serialized unary encoded signal to the delay line.

31. The method of claim 29, wherein the delay line includes the first output and a second output, wherein the at least one pulse edge is delayed by a first delay period via the first output or by a second delay period via the second output.

32. The method of claim 31, further comprising selecting the first output or the second output based, at least in part, on a second portion of the multi-level digital signal.

33. The method of claim 31, wherein the first delay period and the second delay period are fractional portions of a digital pulse width modulator clock period.

* * * * *